United States Patent
Boursat et al.

(10) Patent No.: US 6,586,783 B2
(45) Date of Patent: Jul. 1, 2003

(54) SUBSTRATE FOR AN ELECTRONIC POWER CIRCUIT, AND AN ELECTRONIC POWER MODULE USING SUCH A SUBSTRATE

(75) Inventors: Benoît Boursat, Bizanos (FR); Emmanuel Dutarde, Aureilhan (FR); Nathalie Martin, Horgues (FR); Pierre Solomalala, Aureilhan (FR); José Saiz, Cenon (FR)

(73) Assignee: Alstom, Paris (FR)

( * ) Notice: Subject to any disclaimer, the term of this patent is extended or adjusted under 35 U.S.C. 154(b) by 0 days.

(21) Appl. No.: 10/059,359

(22) Filed: Jan. 31, 2002

(65) Prior Publication Data

US 2002/0125505 A1 Sep. 12, 2002

(30) Foreign Application Priority Data

Mar. 8, 2001 (FR) .............................. 01 03184

(51) Int. Cl.⁷ .............................................. H01L 27/10
(52) U.S. Cl. ...................... 257/207; 257/207; 257/714
(58) Field of Search ................... 257/207, 714, 257/722, 716, 706, 688; 361/388; 174/260

(56) References Cited

U.S. PATENT DOCUMENTS

| 4,868,712 A | * | 9/1989 | Woodman ................... 361/388 |
| 5,672,848 A |   | 9/1997 | Komorita et al. |
| 5,719,444 A | * | 2/1998 | Tilton et al. ................. 257/714 |
| 5,763,951 A | * | 6/1998 | Hamilton et al. ........... 257/714 |
| 5,870,823 A | * | 2/1999 | Bezama et al. ............... 29/848 |
| 6,033,764 A |   | 3/2000 | Balents et al. |

FOREIGN PATENT DOCUMENTS

| DE | 94 04 717 U | 5/1995 |
| EP | 0 196 747 A | 10/1986 |
| EP | 0 339 881 A | 11/1989 |
| EP | 0 798 781 A | 10/1997 |

* cited by examiner

*Primary Examiner*—Hoai Ho
*Assistant Examiner*—Thinh T. Nguyen
(74) *Attorney, Agent, or Firm*—Sughrue Mion, PLLC

(57) ABSTRACT

An electronic power circuit substrate including a wafer of electrically insulating material, wherein said wafer presents a face supporting one or more conductive tracks directly connected to one or more electronic power components, said conductive tracks being obtained by fine metallization of said face to a thickness that is less than 150 μm.

20 Claims, 1 Drawing Sheet

SUBSTRATE FOR AN ELECTRONIC POWER CIRCUIT, AND AN ELECTRONIC POWER MODULE USING SUCH A SUBSTRATE

The present invention relates to a substrate for an electronic power circuit, and more particularly to a substrate that needs to withstand a large potential difference between the various conductive tracks placed on one face of the substrate and the opposite face of the substrate, while nevertheless providing good heat exchange. The substrate of the invention is for supporting power semiconductors, and in particular isolated gate bipolar transistors (IGBT) as used in power distribution circuits in the railway field and in the power transport field in which voltages are particularly high.

BACKGROUND OF THE INVENTION

In the prior art it is known to have substrates for electronic power circuits that comprise an electrically insulating wafer of alumina with its bottom and top surfaces being covered in respective copper sheets having a thickness of about 300 micrometers ($\mu$m), the sheets being applied by using the direct bonding copper (DBC) method. To improve cooling, a radiator is placed in contact with the bottom copper sheet so as to dump the heat given off by the power components.

It is also known to improve the performance of such a substrate, and in particular to reduce its thermal resistance, by replacing the electrically insulating wafer of alumina with an insulating material that possesses better thermal conductivity, such as aluminum nitride AlN. Nevertheless, such a substrate presents the drawback of having bonding layers formed by the DBC method at the interface between the AlN wafer and the copper metallization, said layers constituting a thermal barrier that greatly reduces the heat transmission capacity of the substrate. Improving the performance of such a substrate thus requires the properties of the insulating material to be improved and the quality of the interface between the copper and the insulating material to be improved, and that cannot be achieved with the DBC method.

OBJECT AND SUMMARY OF THE INVENTION

The object of the present invention is thus to propose a novel type of substrate for receiving electronic power components and possessing improved performance, in particular reduced thermal resistance, and which is simple and of low cost to make.

To this end, the invention provides an electronic power circuit substrate including a wafer of electrically insulating material, wherein said wafer presents a face supporting one or more conductive tracks directly connected to one or more electronic power components, said conductive tracks being obtained by fine metallization to a thickness that is less than 150 $\mu$m.

In particular embodiments, the substrate for an electronic power circuit can include one or more of the following characteristics taken singly or in any technically feasible combination:

the conductive tracks are made of copper and are obtained by electrolytic growth;
the thickness of the copper conductive tracks lies in the range 100 $\mu$m to 150 $\mu$m;
the electronic power components are IGBT components;
the wafer is made of aluminum nitride;
the bottom face of the wafer has channel-forming stripes in which a cooling fluid flows; and
the wafer has a single metallized face.

The invention also provides an electronic power module including at least one electronic power component mounted on a substrate in accordance with the above-described characteristics.

BRIEF DESCRIPTION OF THE DRAWING

The objects, aspects, and advantages of the present invention will be better understood on reading the following description of an embodiment of the invention given by way of non-limiting example, and with reference to the accompanying drawing, in which.

MORE DETAILED DESCRIPTION

Figure 1:
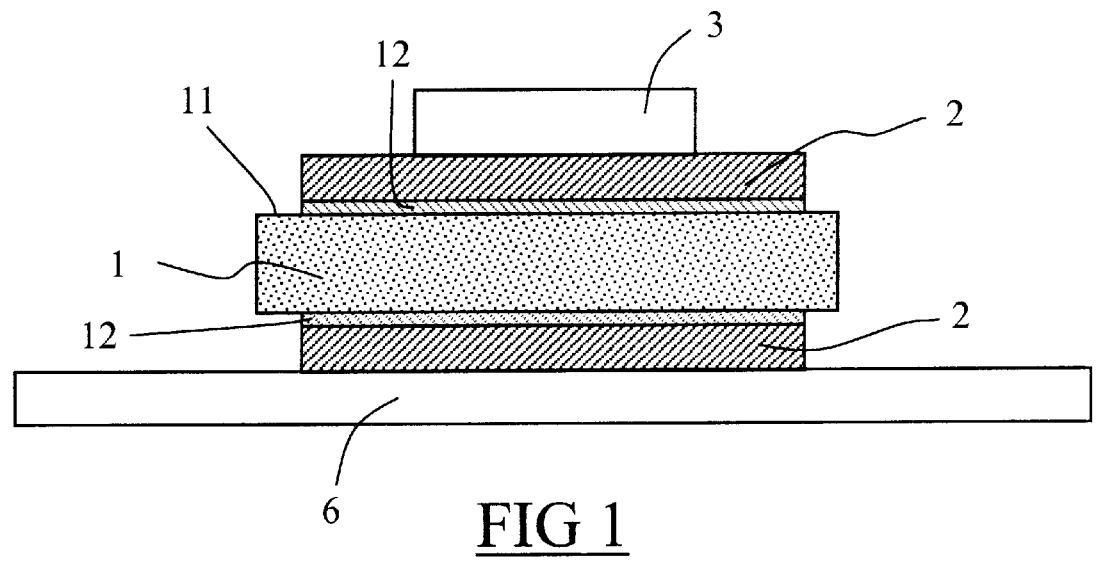
FIG. 1 is a diagrammatic section view through a power module including a prior art substrate.

To make the drawing easier to read, only those elements which are necessary for understanding the invention are shown. The same elements are given the same references in both figures.

FIG. 1 shows a power module provided with a prior art substrate comprising an electrically insulating wafer 1 of aluminum nitride AlN having a thickness of about 635 um and covered on its bottom and top faces in respective sheets of copper 2. The copper sheets 2 are about 300 um thick and they are deposited by a DBC method consisting of bringing copper sheets 2 onto the AlN wafer 1 and in raising the assembly to a very high temperature so as to create respective bonding layers 12 that are about 5 um thick at the interfaces between the copper sheets 2 and the aluminum nitride wafer 1. In such a substrate, the top copper sheet 2 is used to make conductive tracks for receiving a power component 3 such as an IGBT component, while the bottom copper sheet 2 serves both to compensate stresses generated by differential expansion between the tope copper sheet 2 and the AlN wafer 1, so as to avoid any deformation of the substrate, and also to allow a cooling radiator 6 to be soldered thereto in order to dump the heat given off by the power components 3.

Figure 2:
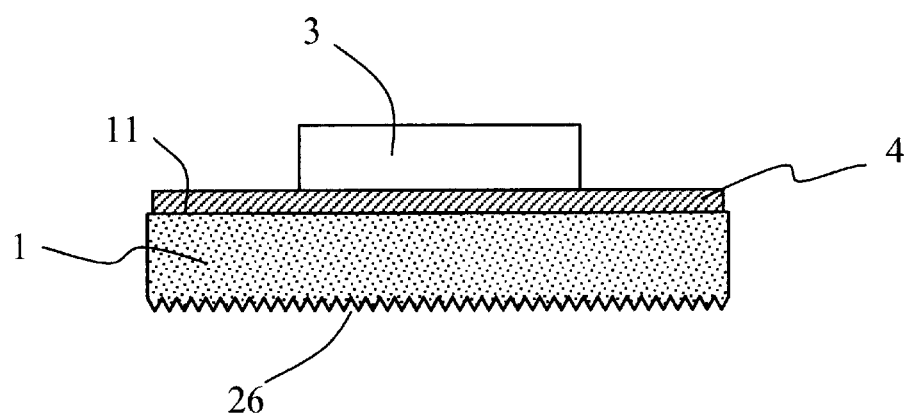
FIG. 2 is a diagrammatic section view through a power module including a substrate constituting a particular embodiment of the invention.

FIG. 2 shows a power module including a substrate constituting a particular embodiment of the invention. In this figure, the substrate has an aluminum nitride wafer 1 similar to that described with reference to FIG. 1, and its top face 11 is covered in a layer of copper 4 of thickness less than or equal to 150 $\mu$m, and made by electrolytic growth. This layer of copper 4 is used to constitute one or more conductive tracks on which a power component is direcly connected, such as an IGBT component 3.

To enable the copper layer 4 to be deposited by electrolytic growth, the top face 11 of the aluminum nitride wafer 1 must previously be metallized, where said metallization can be obtained by activating the surface by caustic soda etching or by UV laser treatment, followed by chemical nickel plating. Naturally, such metallization of the surface is performed only on the surface of the top face 11 which is to receive the conductive tracks.

The thickness of the copper layer 4 obtained by electrolytic growth lies preferably in the range 100 $\mu$m to 150 $\mu$m, and it is a function of the current density that needs to be conveyed to and from the IGBT component 3 and the efficiency of substrate cooling.

The bottom face of the wafer 1 has channel-forming stripes 26 carrying a flow of cooling fluid for cooling the IGBT component 3 directly.

Such a substrate presents the advantage of possessing a single layer of copper only, and thus only one interface between the insulating wafer and copper, thereby considerably reducing the thermal resistance of the substrate. Furthermore, the Applicant has observed that having a layer of copper that is thin (less than 150 $\mu$m) makes it possible considerably to reduce the mechanical stresses inside the substrate that are caused by the difference in thermal expansion between aluminum nitride (4.2 $\mu$m/m) and copper (16.4 $\mu$m/m), and is sufficient to carry the current densities encountered in power electronics with efficient cooling. As a result such a substrate presents increased lifetime and decreased thermal resistance for a manufacturing cost that is lower since it involves single metallization only and that metallization is of fine thickness.

Naturally, the invention is not limited to the embodiment described and shown which has been given purely by way of example.

Thus, in a variant embodiment (not shown), the substrate of the invention could have fine metallization (less than 150 $\mu$m thick) on its bottom face also when this face is to be put into contact with a conventional cooling radiator, with the metallization thus making it possible to solder the radiator onto the substrate.

What is claimed is:

1. An electronic power circuit substrate including a wafer of electrically insulating material, wherein said wafer includes a face supporting one or more conductive tracks directly connected to one or more electronic power components, said conductive tracks being obtained by fine metallization of said face, said conductive tracks having a thickness that is less than 150 $\mu$m.

2. An electronic power circuit substrate according to claim 1, wherein said conductive tracks are made of copper and are obtained by electrolytic growth.

3. An electronic power circuit substrate according to claim 2, wherein the thickness of said copper conductive tracks is greater than 100 $\mu$m.

4. An electronic circuit substrate according to claim 1, wherein said electronic power components are isolated gate bipolar transistor components.

5. An electronic circuit substrate according to claim 1, wherein said wafer is made of aluminum nitride.

6. An electronic circuit substrate according to claim 1, wherein the bottom face of said wafer has channel-forming stripes in which a cooling fluid flows.

7. An electronic power circuit substrate according to claim 1, wherein said wafer has a single metallized face.

8. An electronic power module, including at least one electronic power component mounted on a substrate according to claim 1.

9. An electronic power circuit substrate comprising:

a wafer of electrically insulating material with a face;

a conductive track provided on said face, said conductive track directly connected to an electronic power component, said conductive track having a thickness that is less than 150 $\mu$m.

10. An electronic power circuit substrate according to claim 9, wherein said conductive track is made of copper and is obtained by electrolytic growth.

11. An electronic power circuit substrate according to claim 10, wherein the thickness of said copper conductive track is greater than 100 $\mu$m.

12. An electronic circuit substrate according to claim 9, wherein said electronic power component is an isolated gate bipolar transistor component.

13. An electronic circuit substrate according to claim 9, wherein said wafer is made of aluminum nitride.

14. An electronic circuit substrate according to claim 9, wherein a bottom face of said wafer has channel-forming stripes in which a cooling fluid flows.

15. An electronic power circuit substrate according to claim 9, wherein said wafer has a single face for connecting to power components.

16. An electronic power module, including at least one electronic power component mounted on a substrate according to claim 9.

17. An electronic power circuit substrate comprising:

a wafer of electrically insulating material, said wafer including a nickel-plated face;

a conductive track provided on said nickel-plated face, said conductive track directly connected to an electronic power component.

18. An electronic power circuit substrate according to claim 17, wherein said conductive track is made of copper and is obtained by electrolytic growth.

19. An electronic power circuit substrate according to claim 17, wherein said face is activated via caustic etching or laser treatment prior to being nickel-plated.

20. An electronic circuit substrate according to claim 17, wherein said nickel-plating is performed chemically.

* * * * *